(12) United States Patent
Baldwin et al.

(10) Patent No.: US 7,314,537 B2
(45) Date of Patent: Jan. 1, 2008

(54) METHOD AND APPARATUS FOR DETECTING A PLASMA

(75) Inventors: Craig T. Baldwin, Phoenix, AZ (US); Carl M. Spearow, Gilbert, AZ (US); Mirko Vukovic, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 10/674,920

(22) Filed: Sep. 30, 2003

(65) Prior Publication Data

US 2005/0067102 A1    Mar. 31, 2005

(51) Int. Cl.
C23F 1/00 (2006.01)
H01L 21/306 (2006.01)
C23C 16/00 (2006.01)
(52) U.S. Cl. ............... 156/345.28; 118/688; 118/723 R
(58) Field of Classification Search ............ 118/723 R, 118/663, 688; 156/345.28
See application file for complete search history.

(56) References Cited

U.S. PATENT DOCUMENTS

| | | | |
|---|---|---|---|
| 3,572,948 A | 3/1971 | Catherin | |
| 5,025,135 A * | 6/1991 | Gesche et al. | 219/506 |
| 5,175,472 A * | 12/1992 | Johnson et al. | 315/111.21 |
| 5,325,019 A | 6/1994 | Miller et al. | |
| 5,458,732 A * | 10/1995 | Butler et al. | 216/61 |
| 5,472,561 A | 12/1995 | Williams et al. | |
| 5,576,629 A | 11/1996 | Turner et al. | |
| 5,691,642 A * | 11/1997 | Dobkin | 324/464 |
| 5,971,591 A * | 10/1999 | Vona et al. | 700/220 |
| 6,060,329 A * | 5/2000 | Kamata et al. | 438/9 |
| 6,351,683 B1 | 2/2002 | Johnson et al. | |
| 6,467,013 B1 * | 10/2002 | Nizar | 711/1 |
| 6,863,018 B2 * | 3/2005 | Koizumi et al. | 118/723 E |
| 2001/0051437 A1 * | 12/2001 | Cruse | 438/706 |
| 2002/0135378 A1 * | 9/2002 | Coumou | 324/464 |
| 2004/0004708 A1 * | 1/2004 | Willis | 356/72 |

FOREIGN PATENT DOCUMENTS

| | | |
|---|---|---|
| EP | 458324 A2 * | 11/1991 |
| EP | 568920 A1 * | 11/1993 |
| JP | 01226153 A * | 9/1989 |

* cited by examiner

*Primary Examiner*—Karla Moore
(74) *Attorney, Agent, or Firm*—Wood, Herron & Evans, L.L.P.

(57) ABSTRACT

The present invention presents an improved apparatus and method for monitoring a material processing system, where the material processing system includes a processing tool, test signal source, and a filter/detector. The test signal source providing a first test signal and a second test signal to the processing chamber, and the filter/detector detecting an intermodulation product of the first test signal and the second test signal generated when a plasma is created.

19 Claims, 3 Drawing Sheets

METHOD AND APPARATUS FOR DETECTING A PLASMA

FIELD OF THE INVENTION

The present invention relates to detecting a plasma in a processing system and, more particularly, to detecting a plasma using a simple and inexpensive monitoring device.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

During, for example, a deposition or an etch process, monitoring the plasma processing system can be very important when determining the state of a plasma processing system and ensuring the quality of devices being produced. Additional process data can be used to prevent erroneous conclusions regarding the state of the system and the state of the products being produced. For example, the continuous use of a plasma processing system can lead to a gradual degradation of the plasma processing performance and ultimately to complete failure of the system.

Plasma can enable and/or enhance processes used by the semiconductor industry. In many instances it is critical that semiconductor equipment possess a mechanism for determining plasma presence to complete a process. In fact, proceeding with the manufacture of semiconductor devices without a plasma, when one is expected, often results in the scrapping of product.

Many techniques are available to monitor and detect the presence of plasma, however, most require cost prohibitive components and/or require physical contact with the plasma.

SUMMARY OF THE INVENTION

The present invention provides an apparatus and method for detecting plasma in a processing system and, more particularly, to an apparatus and method for detecting a plasma using a simple and inexpensive monitoring device.

According to principles of the present invention, a plasma processing apparatus used in semiconductor manufacture is provided with two RF signals coupled to the processing space in a vacuum chamber that is occupied by a plasma during processing. The apparatus is also provided with an RF detector having an input coupled to the processing space and configured to detect an intermodulation product of the two RF signals. The output of the detector is coupled to the controller of the apparatus, to which it provides an output signal having one state when a plasma is present in the processing space and another state when a signal is absent from the processing space.

The two signals are in the range of frequencies effective to couple energy to and from the plasma, depending on the parameters of the system, which range includes those frequencies used to excite or ignite a plasma. The two signals may include RF energy being coupled to the plasma to sustain the plasma. The two signals may also include RF energy being coupled to a substrate to bias the substrate. The two signals may also include RF energy being coupled to a target to sputter the target. More commonly, one or both of the two signals will include RF energy being coupled to the processing space solely for purposes of serving as a test signal. Any two signals, which, if multiplied together, will form an intermodulation product, may be used.

When no plasma is present in the processing space, the two signals, or their sum, will be detectable at the detector, but certain intermodulation or multiplication products of the signals will be absent. When a plasma is present in the processing space, the plasma presents a nonlinear electrical impedance to the two signals, which has the effect of combining the two signals in a signal multiplier. As a result, certain intermodulation products are detectable at the detector. According to principles of the invention, a detector is provided that is configured to detect certain intermodulation products from the processing space that are produced in the space when a plasma is present, but are not so found when a plasma is absent from the processing space.

The coupling of the signals to the space and the coupling of product signals from the space to the detector may employ antennas specifically provided for that purpose or may rely on a substrate support, plasma electrodes or other components in an RF coupling relationship with the processing space.

The control logic of the apparatus responds to the output of the detector and controls the apparatus or drives monitoring devices so that the performance of the process can be conditioned on the ignition state of a plasma, when required.

By utilizing the nonlinear electrical impedance characteristics of the plasma, the present invention provides a reliable, process independent means for detecting plasma without requiring highly specialized and expensive components.

The present invention also provides a means for detecting plasma in a material processing system that includes at least one low-cost RF source and at least one low-cost filter/detector assembly.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention is described in the context of a number of exemplary embodiments in which two signals are coupled into a processing space, and the presence or absence of certain intermodulation products of the two signals are detected from the processing space to determine whether or not a plasma is present in the processing space.

The present invention provides an improved material processing system that can include a processing tool, which can comprise one or more process chambers. In addition, the processing system can include a plurality of RF-responsive process sensors that are coupled to the processing tool to generate and transmit process data and at least one SIA configured to receive the process data from at least one of the plurality of RF-responsive process sensors.

Figure 1:
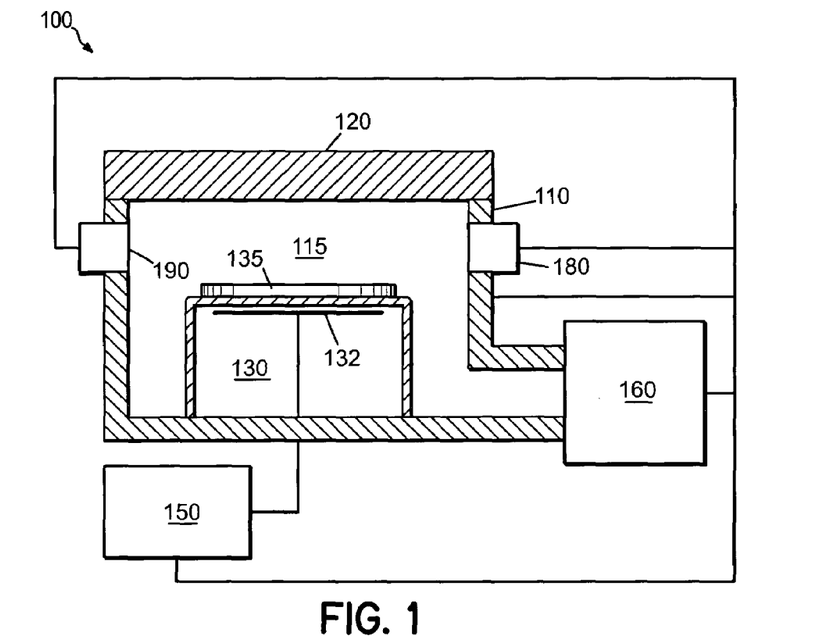
FIG. 1 illustrates a simplified block diagram of a material processing system in accordance with an embodiment of the present invention.

FIG. 1 illustrates a simplified block diagram for a material processing system in accordance with an embodiment of the present invention. For example, material processing system 100 can comprise an etch system, such as a plasma etcher. Alternately, material processing system 100 can comprise a photoresist coating system such as a photoresist spin coating system, and/or material processing system 100 can comprise a photoresist patterning system such as a lithography system. In another embodiment, material processing system 100 can comprise a dielectric coating system such as a spin-on-glass (SOG) or spin-on-dielectric (SOD) system. In another embodiment, material processing system 100 can comprise a deposition chamber such as a chemical vapor deposition (CVD) system, a physical vapor deposition (PVD) system, an atomic layer deposition (ALD) system, and/or combinations thereof. In an additional embodiment, material processing system 100 can comprise a thermal processing system such as a rapid thermal processing (RTP) system. In another embodiment, material processing system 100 can comprises a batch diffusion furnace or other semiconductor processing system.

In the illustrated embodiment, material processing system 100 comprises processing chamber 110, upper assembly 120, substrate holder 130 for supporting substrate 135, pumping system 160, and controller 170. For example, pumping system 160 can provide a controlled pressure in processing chamber 110. For example, processing chamber 110 can facilitate the formation of a processing gas in a process space 115 adjacent substrate 135. The material processing system 100 can be configured to process 200 mm substrates, 300 mm substrates, or larger substrates. Alternately, the material processing system can operate by generating plasma in one or more processing chambers.

Substrate 135 can be, for example, transferred into and out of processing chamber 110 through a slot valve (not shown) and chamber feed-through (not shown) via robotic substrate transfer system where it can be received by substrate lift pins (not shown) housed within substrate holder 130 and mechanically translated by devices housed therein. Once substrate 135 is received from substrate transfer system, it can be lowered to an upper surface of substrate holder 130.

Substrate 135 can be, for example, affixed to the substrate holder 130 via an electrostatic clamping system. Furthermore, substrate holder 130 can further include a cooling system including a re-circulating coolant flow that receives heat from substrate holder 130 and transfers heat to a heat exchanger system (not shown), or when heating, transfers heat from the heat exchanger system. Moreover, gas can, for example, be delivered to the backside of substrate 135 via a backside gas system to improve the gas-gap thermal conductance between substrate 135 and substrate holder 130. Such a system can be utilized when temperature control of the substrate is required at elevated or reduced temperatures. In other embodiments, heating elements, such as resistive heating elements, or thermoelectric heaters/coolers can be included.

In alternate embodiments, substrate holder 130 can, for example, further comprise a vertical translation device (not shown) that can be surrounded by a bellows (not shown) coupled to the substrate holder 130 and the processing chamber 110, and configured to seal the vertical translation device from the reduced pressure atmosphere in processing chamber 110. Additionally, a bellows shield (not shown) can, for example, be coupled to the substrate holder 130 and configured to protect the bellows. Substrate holder 130 can, for example, further provide a focus ring (not shown), a shield ring (not shown), and a baffle plate (not shown).

In the illustrated embodiment, shown in FIG. 1, substrate holder 130 can comprise an electrode 132 through which RF power can be coupled to the processing plasma in process space 115. For example, substrate holder 130 can be electrically biased at an RF voltage via the transmission of RF power from RF system 150. The RF bias can serve to heat electrons to form and maintain plasma. In this configuration, the material system can operate as a reactive ion etch (RIE) reactor, wherein the chamber and upper gas injection electrode serve as ground surfaces. A typical frequency for the RF bias can range from 1 MHz to 100 MHz. For example, semiconductor processing systems that use 13.56 MHz for plasma processing are well known to those skilled in the art. In an alternate embodiment, substrate holder can be grounded or floating.

As shown in FIG. 1, upper assembly 120 can be coupled to the processing chamber 110 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, and provide a surface wave plasma source.

For example, upper assembly 120 can comprise an electrode, an insulator ring, an antenna, a transmission line, and/or other RF components (not shown). In addition, upper assembly 120 can comprise permanent magnets, electromagnets, and/or other magnet system components (not shown). Also, upper assembly 120 can comprise supply lines, injection devices, mass flow controllers, and/or other gas supply system components (not shown). Furthermore, upper assembly 120 can comprise a housing, a cover, sealing devices, and/or other mechanical components (not shown).

In an alternate embodiment, processing chamber 110 can comprise a monitoring port (not shown). A monitoring port can, for example, permit optical monitoring of process space 115.

Material processing system 100 also comprises at least one source for providing at least two RF signals. As shown in the illustrated embodiment, test signal source 190 can be used to generate and transmit at least two RF signals. For example, Test signal source 190 can comprise an antenna coupled to the process chamber for transmitting at least RF signals into the process space. In one embodiment, the two RF signals can be at different frequencies. Alternately, the two RF signals can be at the same frequency.

Material processing system 100 also comprises at least one filter/detector device for receiving and processing RF signals generated by plasma in the process space 115. In one embodiment, filter/detector 180 can comprise a narrow-band RF-filter (not shown) and a diode detector (not shown). Filter/detector 180 can be coupled to controller 170, and can exchange data with the controller. Filter/detector 180 can operate using a single frequency band or multiple frequency bands, and filter/detector 180 can operate using one or more center frequencies.

Material processing system 100 also comprises a controller 170. Controller 170 can be coupled to chamber 110, upper assembly 120, substrate holder 130, RF system 150, pumping system 160, filter/detector 180, and test signal source 190. The controller can be configured to provide control data to the filter/detector 180 and test signal source 190, and receive data such as process data from the filter/detector 180 and test signal source 190. For example, controller 170 can comprise a microprocessor, a memory (e.g., volatile and/or non-volatile memory), and a digital I/O port capable of generating control voltages sufficient to communicate and activate inputs to the processing system 100 as well as monitor outputs from the processing system 100. Moreover, the controller 170 can exchange information with chamber 110, upper assembly 120, substrate holder 130, RF system 150, pumping system 160, filter/detector 180, and test signal source 190. Also, a program stored in the memory can be utilized to control the aforementioned components of a material processing system 100 according to a process recipe. In addition, controller 170 can be configured to analyze the process data, to compare the process data with target process data, and to use the comparison to change a process and/or control the processing tool. Also, the controller can be configured to analyze the process data, to compare the process data with historical process data, and to use the comparison to predict, prevent, and/or declare a fault.

Figure 2:
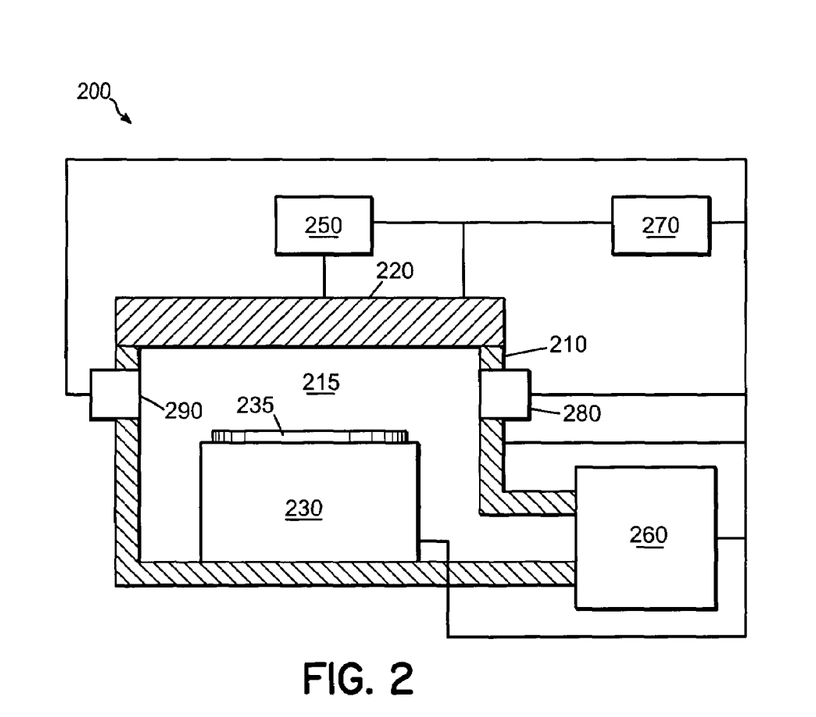
FIG. 2 illustrates a simplified block diagram of another material processing system in accordance with an embodiment of the present invention.

FIG. 2 illustrates a simplified block diagram of another material processing system in accordance with an embodiment of the present invention. For example, material processing system 200 can comprise an etch system, such as a plasma etcher. Alternately, material processing system 200 can comprise a photoresist coating system such as a photoresist spin coating system, and/or material processing system 200 can comprise a photoresist patterning system such as a lithography system. In another embodiment, material processing system 200 can comprise a dielectric coating system such as a spin-on-glass (SOG) or spin-on-dielectric (SOD) system. In another embodiment, material processing system 200 can comprise a deposition chamber such as a chemical vapor deposition (CVD) system, a physical vapor deposition (PVD) system, an atomic layer deposition (ALD) system, and/or combinations thereof. In an additional embodiment, material processing system 200 can comprise a thermal processing system such as a rapid thermal processing (RTP) system. In another embodiment, material processing system 200 can comprises a batch diffusion furnace or other semiconductor processing system.

In the illustrated embodiment, material processing system 200 comprises processing chamber 210, upper assembly 220, substrate holder 230 for supporting substrate 235, pumping system 260, and controller 270. For example, pumping system 260 can provide a controlled pressure in processing chamber 210. For example, processing chamber 210 can facilitate the formation of a processing gas in a process space 215 adjacent to substrate 235. The material processing system 200 can be configured to process 200 mm substrates, 300 mm substrates, or larger substrates. Alternately, the material processing system can operate by generating plasma in one or more processing chambers.

Substrate 235 can be, for example, transferred into and out of processing chamber 210 through a slot valve (not shown) and chamber feed-through (not shown) via robotic substrate transfer system where it can be received by substrate lift pins (not shown) housed within substrate holder 230 and mechanically translated by devices housed therein. Once substrate 235 is received from substrate transfer system, it can be lowered to an upper surface of substrate holder 230.

Substrate 235 can be, for example, affixed to the substrate holder 230 via an electrostatic clamping system. Furthermore, substrate holder 230 can further include a cooling system including a re-circulating coolant flow that receives heat from substrate holder 230 and transfers heat to a heat exchanger system (not shown), or when heating, transfers heat from the heat exchanger system. Moreover, gas can, for example, be delivered to the backside of substrate 235 via a backside gas system to improve the gas-gap thermal conductance between substrate 235 and substrate holder 230. Such a system can be utilized when temperature control of the substrate is required at elevated or reduced temperatures. In other embodiments, heating elements, such as resistive heating elements, or thermo-electric heaters/coolers can be included.

In alternate embodiments, substrate holder 230 can, for example, further comprise a vertical translation device (not shown) that can be surrounded by a bellows (not shown) coupled to the substrate holder 230 and the processing chamber 210, and configured to seal the vertical translation device from the reduced pressure atmosphere in processing chamber 210. Additionally, a bellows shield (not shown) can, for example, be coupled to the substrate holder 230 and configured to protect the bellows. Substrate holder 230 can, for example, further provide a focus ring (not shown), a shield ring (not shown), and a baffle plate (not shown).

In the illustrated embodiment, shown in FIG. 2, upper assembly 230 can comprise a means through which power can be coupled to the processing plasma in process space 215. For example, RF power can be provided by an RF system 250 to a deposition system (not shown). A typical frequency for the RF bias can range from 2 MHz to 200 MHz. For example, semiconductor processing systems that use 13.56 MHz for plasma processing are well known to those skilled in the art. In various embodiments, the substrate holder can be grounded or floating.

As shown in FIG. 2, upper assembly 220 can be coupled to the processing chamber 210 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, provide a surface wave plasma source, and provide a deposition source.

In alternate embodiments, upper assembly 220 can comprise an electrode, an insulator ring, an antenna, a transmission line, and/or other RF components (not shown). In addition, upper assembly 220 can comprise permanent magnets, electromagnets, and/or other magnet system components (not shown). Also, upper assembly 220 can comprise supply lines, injection devices, mass flow controllers, and/or other gas supply system components (not shown). Furthermore, upper assembly 220 can comprise a housing, a cover, sealing devices, and/or other mechanical components (not shown).

In an alternate embodiment, processing chamber 210 can comprise a monitoring port (not shown). A monitoring port can, for example, permit optical monitoring of process space 215.

Material processing system 200 also comprises at least one source for providing at least two RF signals. As shown in the illustrated embodiment, test signal source 290 can be used to generate and transmit at least two RF signals. For example, test signal source 290 can comprise an antenna coupled to the process chamber for transmitting at least RF signals into the process space. In one embodiment, the two RF signals can be at different frequencies. Alternately, the two RF signals can be at the same frequency. For example, the two RF signals can range from 10 MHz to 1500 MHz.

Material processing system 200 also comprises at least one filter/detector device for receiving and processing RF signals generated by plasma in the process space 215. In one embodiment, filter/detector 280 can comprise one or more narrow-band RF-filters (not shown) and associated diode detectors (not shown). Filter/detector 280 can be coupled to controller 270, and can exchange data with the controller. Filter/detector 280 can operate using a single frequency band or multiple frequency bands, and filter/detector 280 can operate using one or more center frequencies.

Material processing system 200 also comprises a controller 270. Controller 270 can be coupled to chamber 210, upper assembly 220, substrate holder 230, RF system 250, pumping system 260, filter/detector 280, and test signal source 290. The controller can be configured to provide control data to the filter/detector 280 and test signal source 290, and receive data such as process data from the filter/detector 280 and test signal source 290. For example, controller 270 can comprise a microprocessor, a memory (e.g., volatile and/or non-volatile memory), and a digital I/O port capable of generating control voltages sufficient to communicate and activate inputs to the processing system 200 as well as monitor outputs from the processing system 200. Moreover, the controller 270 can exchange information with chamber 210, upper assembly 220, substrate holder 230, RF system 250, pumping system 260, filter/detector 280, and test signal source 290. Also, a program stored in the memory can be utilized to control the aforementioned components of a material processing system 200 according to a process recipe. In addition, controller 270 can be configured to analyze the process data, including plasma ignition data, to compare process data such as plasma ignition data with target process data, and to use the comparison to change a process and/or control the processing tool. Also, the controller can be configured to analyze plasma ignition data, to compare the plasma ignition data with historical plasma ignition data, and to use the comparison to predict, prevent, and/or declare a fault. For example, the plasma ignition data can comprise inter-modulation product data.

Figure 3:
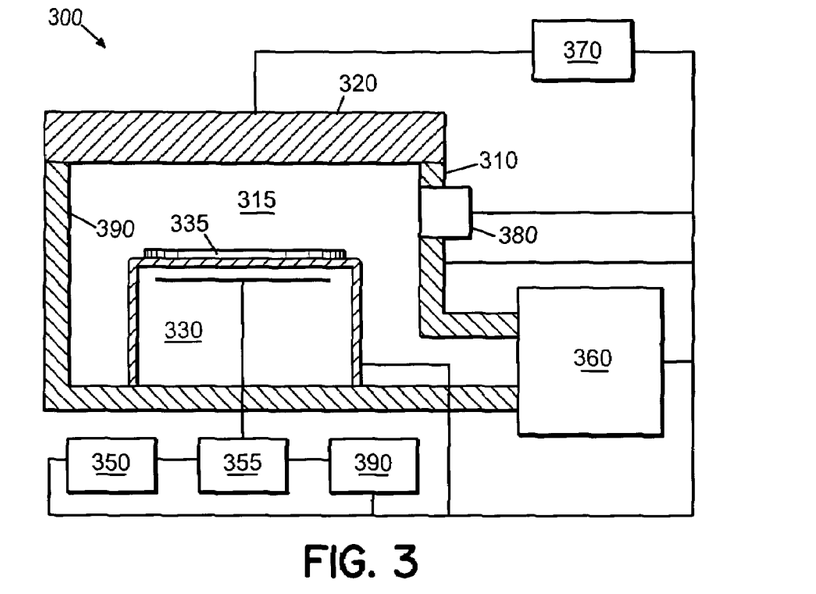
FIG. 3 illustrates a simplified block diagram of another material processing system in accordance with an embodiment of the present invention.

FIG. 3 illustrates a simplified block diagram of another material processing system in accordance with an embodiment of the present invention. For example, material processing system 300 can comprise an etch system, such as a plasma etcher. Alternately, material processing system 300 can comprise a photoresist coating system such as a photoresist spin coating system, and/or material processing system 300 can comprise a photoresist patterning system such as a lithography system. In another embodiment, material processing system 300 can comprise a dielectric coating system such as a spin-on-glass (SOG) or spin-on-dielectric (SOD) system. In another embodiment, material processing system 300 can comprise a deposition chamber such as a chemical vapor deposition (CVD) system, a physical vapor deposition (PVD) system, an atomic layer deposition (ALD) system, and/or combinations thereof. In an additional embodiment, material processing system 300 can comprise a thermal processing system such as a rapid thermal processing (RTP) system. In another embodiment, material processing system 300 can comprises a batch diffusion furnace or other semiconductor processing system.

In the illustrated embodiment, material processing system 300 comprises processing chamber 310, upper assembly 320, substrate holder 330 for supporting substrate 335, pumping system 360, and controller 370. For example, pumping system 360 can provide a controlled pressure in processing chamber 310. For example, processing chamber 310 can facilitate the formation of a processing gas in a process space 315 adjacent substrate 335. The material processing system 300 can be configured to process 200 mm substrates, 300 mm substrates, or larger substrates. Alternately, the material processing system can operate by generating plasma in one or more processing chambers.

Substrate 335 can be, for example, transferred into and out of processing chamber 310 through a slot valve (not shown) and chamber feed-through (not shown) via robotic substrate transfer system where it can be received by substrate lift pins (not shown) housed within substrate holder 330 and mechanically translated by devices housed therein. Once substrate 335 is received from substrate transfer system, it can be lowered to an upper surface of substrate holder 330.

Substrate 335 can be, for example, affixed to the substrate holder 330 via an electrostatic clamping system. Furthermore, substrate holder 330 can further include a cooling system including a re-circulating coolant flow that receives heat from substrate holder 330 and transfers heat to a heat exchanger system (not shown), or when heating, transfers heat from the heat exchanger system. Moreover, gas can, for example, be delivered to the backside of substrate 335 via a backside gas system to improve the gas-gap thermal conductance between substrate 335 and substrate holder 330. Such a system can be utilized when temperature control of the substrate is required at elevated or reduced temperatures. In other embodiments, heating elements, such as resistive heating elements, or thermoelectric heaters/coolers can be included.

In alternate embodiments, substrate holder 330 can, for example, further comprise a vertical translation device (not shown) that can be surrounded by a bellows (not shown) coupled to the substrate holder 330 and the processing chamber 310, and configured to seal the vertical translation device from the reduced pressure atmosphere in processing chamber 310. Additionally, a bellows shield (not shown) can, for example, be coupled to the substrate holder 330 and configured to protect the bellows. Substrate holder 330 can, for example, further provide a focus ring (not shown), a shield ring (not shown), and a baffle plate (not shown).

In the illustrated embodiment, shown in FIG. 3, substrate holder 330 can comprise an electrode 332 through which RF power can be coupled to the processing plasma in process space 315. For example, substrate holder 330 can be electrically biased at an RF voltage via the transmission of RF power from RF system 350 through RF subsystem 355. A typical frequency for the RF bias can range from 1 MHz to 100 MHz. For example, semiconductor processing systems that use 13.56 MHz for plasma processing are well known to those skilled in the art.

As shown in FIG. 3, upper assembly 320 can be coupled to the processing chamber 310 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, provide a surface wave plasma source, and provide a deposition source.

In alternate embodiments, upper assembly 320 can comprise an electrode, an insulator ring, an antenna, a transmission line, and/or other RF components (not shown). In addition, upper assembly 320 can comprise permanent magnets, electromagnets, and/or other magnet system components (not shown). Also, upper assembly 320 can comprise supply lines, injection devices, mass flow controllers, and/or other gas supply system components (not shown). Furthermore, upper assembly 320 can comprise a housing, a cover, sealing devices, and/or other mechanical components (not shown).

In an alternate embodiment, processing chamber 310 can comprise a monitoring port (not shown). A monitoring port can, for example, permit optical monitoring of process space 315.

Material processing system 300 also comprises at least one source for providing at least two test RF signals. As shown in the illustrated embodiment, test source 390 can be used to generate and transmit at least two RF signals. These two RF signals can be combined with the RF system bias signal in RF subsystem 355 and transmitted into the chamber using the electrode 332. In one embodiment, the two RF signals can be at different frequencies. Alternately, the two RF signals can be at the same frequency. For example, the two RF signals can range from 10 MHz to 1500 MHz.

Material processing system 300 also comprises at least one filter/detector device for receiving and processing RF signals generated by plasma in the process space 315. In one embodiment, filter/detector 380 can comprise a narrow-band RF-filter (not shown) and a diode detector (not shown). Filter/detector 380 can be coupled to controller 370, and can exchange data with the controller. Filter/detector 380 can operate using a single frequency band or multiple frequency bands, and filter/detector 380 can operate using one or more center frequencies.

Material processing system 300 also comprises a controller 370. Controller 370 can be coupled to chamber 310, upper assembly 320, substrate holder 330, RF system 350, pumping system 360, filter/detector 380, and test signal source 390. The controller can be configured to provide control data to the filter/detector 380 and test signal source 390, and receive data such as process data from the filter/detector 380 and test signal source 390. For example, controller 370 can comprise a microprocessor, a memory (e.g., volatile and/or non-volatile memory), and a digital I/O port capable of generating control voltages sufficient to communicate and activate inputs to the processing system 300 as well as monitor outputs from the processing system 300. Moreover, the controller 370 can exchange information with chamber 310, upper assembly 320, substrate holder 330, RF system 350, pumping system 360, filter/detector 380, and test signal source 390. Also, a program stored in the memory can be utilized to control the aforementioned components of a material processing system 300 according to a process recipe. In addition, controller 370 can be configured to analyze the process data, including plasma ignition data, to compare process data such as plasma ignition data with target process data, and to use the comparison to change a process and/or control the processing tool. Also, the controller can be configured to analyze plasma ignition data, to compare the plasma ignition data with historical plasma ignition data, and to use the comparison to predict, prevent, and/or declare a fault. For example, the plasma ignition data can comprise inter-modulation product data.

Figure 4:
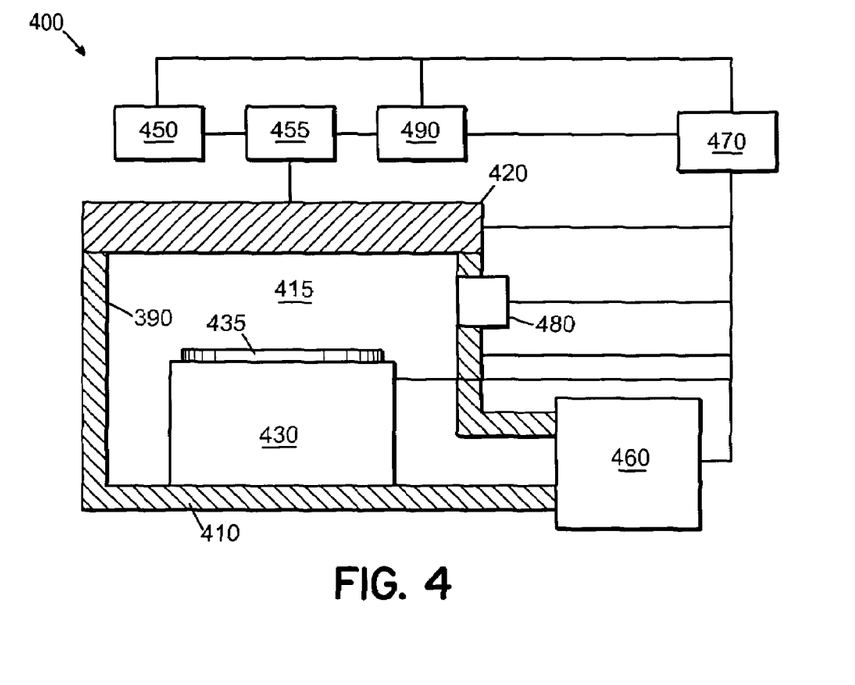
FIG. 4 illustrates a simplified block diagram of another material processing system in accordance with an embodiment of the present invention.

FIG. 4 illustrates a simplified block diagram of another material processing system in accordance with an embodiment of the present invention. For example, material processing system 400 can comprise a deposition system, such as a chemical vapor deposition (CVD) system, a physical vapor deposition (PVD) system, an atomic layer deposition (ALD) system, and/or combinations thereof. Alternately, material processing system 400 can comprise a photoresist coating system such as a photoresist spin coating system, and/or material processing system 400 can comprise a photoresist patterning system such as a lithography system. In another embodiment, material processing system 400 can comprise a dielectric coating system such as a spin-on-glass (SOG) or spin-on-dielectric (SOD) system. In another embodiment, material processing system 400 can comprise an etching chamber. In an additional embodiment, material processing system 400 can comprise a thermal processing system such as a rapid thermal processing (RTP) system. In another embodiment, material processing system 400 can comprises a batch diffusion furnace or other semiconductor processing system.

In the illustrated embodiment, material processing system 400 comprises processing chamber 410, upper assembly 420, substrate holder 430 for supporting substrate 435, pumping system 460, and controller 470. For example, pumping system 460 can provide a controlled pressure in processing chamber 410. For example, processing chamber 410 can facilitate the formation of a processing gas in a process space 415 adjacent to substrate 435. The material processing system 400 can be configured to process 2400 mm substrates, 300 mm substrates, or larger substrates. Alternately, the material processing system can operate by generating plasma in one or more processing chambers.

Substrate 435 can be, for example, transferred into and out of processing chamber 410 through a slot valve (not shown) and chamber feed-through (not shown) via robotic substrate transfer system where it can be received by substrate lift pins (not shown) housed within substrate holder 430 and mechanically translated by devices housed therein. Once substrate 435 is received from substrate transfer system, it can be lowered to an upper surface of substrate holder 430.

Substrate 435 can be, for example, affixed to the substrate holder 430 via an electrostatic clamping system. Furthermore, substrate holder 430 can further include a cooling system including a re-circulating coolant flow that receives heat from substrate holder 430 and transfers heat to a heat exchanger system (not shown), or when heating, transfers heat from the heat exchanger system. Moreover, gas can, for example, be delivered to the backside of substrate 435 via a backside gas system to improve the gas-gap thermal conductance between substrate 435 and substrate holder 430. Such a system can be utilized when temperature control of the substrate is required at elevated or reduced temperatures.

In other embodiments, heating elements, such as resistive heating elements, or thermoelectric heaters/coolers can be included.

In alternate embodiments, substrate holder 430 can, for example, further comprise a vertical translation device (not shown) that can be surrounded by a bellows (not shown) coupled to the substrate holder 430 and the processing chamber 410, and configured to seal the vertical translation device from the reduced pressure atmosphere in processing chamber 410. Additionally, a bellows shield (not shown) can, for example, be coupled to the substrate holder 430 and configured to protect the bellows. Substrate holder 430 can, for example, further provide a focus ring (not shown), a shield ring (not shown), and a baffle plate (not shown).

In the illustrated embodiment, shown in FIG. 4, upper assembly 430 can comprise a means through which power can be coupled to the processing plasma in process space 415. For example, one or more components in upper assembly 430 can be electrically biased at an RF voltage via the transmission of RF power from RF system 450 through RF subsystem 455. A typical frequency for the RF bias can range from 1 MHz to 100 MHz. For example, semiconductor processing systems that use 13.56 MHz for plasma processing are well known to those skilled in the art.

As shown in FIG. 4, upper assembly 420 can be coupled to the processing chamber 410 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, provide a surface wave plasma source, and provide a deposition source.

In alternate embodiments, upper assembly 420 can comprise an electrode, an insulator ring, an antenna, a transmission line, and/or other RF components (not shown). In addition, upper assembly 420 can comprise permanent magnets, electromagnets, and/or other magnet system components (not shown). Also, upper assembly 420 can comprise supply lines, injection devices, mass flow controllers, and/or other gas supply system components (not shown). Furthermore, upper assembly 420 can comprise a housing, a cover, sealing devices, and/or other mechanical components (not shown).

In an alternate embodiment, processing chamber 410 can comprise a monitoring port (not shown). A monitoring port can, for example, permit optical monitoring of process space 415.

Material processing system 400 also comprises at least one source for providing at least two RF signals. As shown in the illustrated embodiment, test signal source 490 can be used to generate and transmit at least two RF signals. These two RF signals can be combined with the RF system bias signal in RF subsystem 355 and transmitted into the chamber. In one embodiment, the two RF signals can be at different frequencies. Alternately, the two RF signals can be at the same frequency. For example, the two RF signals can range from 10 MHz to 1500 MHz.

Material processing system 400 also comprises at least one filter/detector device for receiving and processing RF signals generated by plasma in the process space 455. In one embodiment, filter/detector 480 can comprise at least one narrow-band RF-filter (not shown) and associated diode detector(s) (not shown). Filter/detector 480 can be coupled to controller 470, and can exchange data with the controller. Filter/detector 480 can operate using a single frequency band or multiple frequency bands, and filter/detector 480 can operate using one or more center frequencies.

Material processing system 400 also comprises a controller 470. Controller 470 can be coupled to chamber 410, upper assembly 420, substrate holder 430, RF system 450, pumping system 460, filter/detector 480, and test signal source 490. The controller can be configured to provide control data to the filter/detector 480 and test signal source 490, and receive data such as process data from the filter/detector 480 and test signal source 490. For example, controller 470 can comprise a microprocessor, a memory (e.g., volatile and/or non-volatile memory), and a digital I/O port capable of generating control voltages sufficient to communicate and activate inputs to the processing system 400 as well as monitor outputs from the processing system 400. Moreover, the controller 470 can exchange information with chamber 410, upper assembly 420, substrate holder 430, RF system 450, pumping system 460, filter/detector 480, and Test signal source 490. Also, a program stored in the memory can be utilized to control the aforementioned components of a material processing system 400 according to a process recipe. In addition, controller 470 can be configured to analyze the process data, including plasma ignition data, to compare process data such as plasma ignition data with target process data, and to use the comparison to change a process and/or control the processing tool. Also, the controller can be configured to analyze plasma ignition data, to compare the plasma ignition data with historical plasma ignition data, and to use the comparison to predict, prevent, and/or declare a fault. For example, the plasma ignition data can comprise inter-modulation product data.

Figure 5:
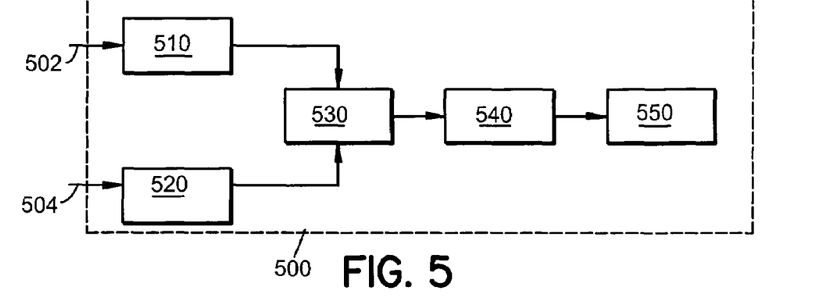
FIG. 5 shows a simplified block diagram of a test signal source in accordance with an embodiment of the present invention.

FIG. 5 shows a simplified block diagram of a test signal source in accordance with an embodiment of the present invention. In the illustrated embodiment, test signal source 500 comprises first source 510, second source 520, summing circuit 530, isolation amplifier 540, and antenna 550.

First source 510 can comprise a sine wave oscillator operating at a single frequency. Second source 520 can also comprise a sine wave oscillator operating at a single frequency. Summing circuit 530 can combine the signal from the first source 510 and the signal from the second source 520 and provide the two signals to the isolation amplifier 540. Isolation amplifier 540 amplifies the two signals and antenna 550 is used to transmit the two signals. For example, antenna can be coupled to a processing chamber and can be used to transmit the two signals into the processing chamber.

In an alternate embodiment, the test signal source does not comprise an antenna and the isolation amplifier is coupled to an RF subsystem (355 FIG. 3 and 455 FIG. 4).

The first source 510 and the second source 520 comprise control signals for turning the sources off and/or on. The first source 510 and the second source 520 can operate using one or more RF frequencies in the range from 10.0 MHz to 200.0 MHz.

Alternately, test source 500 can further comprise at least one of a power source, receiver, transmitter, controller, timer, memory, and a housing.

Test source 500 can be configured to generate the two signals for long periods of time or for short periods of time. For example, the two signals can be generated during a startup period or during one or more periods during the process.

Figure 6:
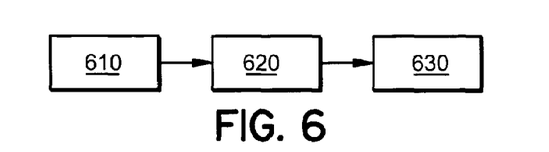
FIG. 6 shows a simplified block diagram of a filter/detector in accordance with an embodiment of the present invention.

FIG. 6 shows a simplified block diagram of a filter/detector in accordance with an embodiment of the present invention. In the illustrated embodiment, filter/detector 600 comprises antenna 610, filter 620, and detector 630.

Antenna 610 can comprise a narrowband antenna coupled to the processing chamber and configured to receive signals generated with the process space. For example, antenna 610 can be configured to receive inter-modulation products generated by the non-linear impedance produced when plasma is created in the process chamber. Filter 620 can be a narrowband filter that is coupled between antenna 610 and detector 630. For example, filter 620 can be configured to pass signals in a narrow frequency range from the antenna to the detector.

In an alternate embodiment, filter/detector 600 can comprise a power source that can include at least one of an RF-to-DC converter, a DC-to-DC converter, and a battery. For example, RF-to-DC converter can comprise at least one of an antenna, diode, and filter. In one case, an RF-to-DC converter can convert at least one process related frequency into a DC signal. In another case, an RF-to-DC converter can convert at least one non-process related frequency into a DC signal. For instance, an external signal can be provided to the converter. Alternately, an RF-to-DC converter can convert at least one plasma related frequency into a DC signal.

In other embodiments, filter/detector 600 can comprise at least one of a signal source, down converter, demodulator, decoder, controller, memory (e.g., volatile or non-volatile), and converters. For example, the filter/detector 600 can be used to receive and process narrowband and wideband signals including AM signals, FM signals, and/or PM signals. In addition, the filter/detector 600 can also receive and process coded signals and/or spread spectrum signals to increase its performance within a high interference environment such as a semiconductor processing facility.

In one example, the test signal source can be configured to provide two RF signals, a first signal at 120 MHz and a second signal at 106.250 MHz. A filter with a passband ranging from 824 MHz to 849 MHz can be used. For example, a filter from the cellular phone industry can be used. In this case, a seventh order intermodulation product (6*120+1*106.25=826.3) can be generated by the plasma and used as a plasma ignition signal.

In another example, the test signal source can be configured to provide two RF signals at 106.250 MHz. A filter with a passband ranging from 525 MHz to 535 MHz can be used. For example, a low cost helical filter from Toko Electronics Co. (TK5416-ND) can be used. In this case, a fifth order intermodulation product (4*106.25+1*106.25=531.5) can be generated by the plasma and used as a plasma ignition signal.

In another example, the test signal source can be configured to provide two RF signals: one at 120 MHz and one at 121 MHz. A filter with a passband ranging from 824 MHz to 849 MHz can be used. For example, a filter from the cellular phone industry can be used. In this case, a seventh order intermodulation product (6*120+1*121=841) can be generated by the plasma and used as a plasma ignition signal.

Figure 7:
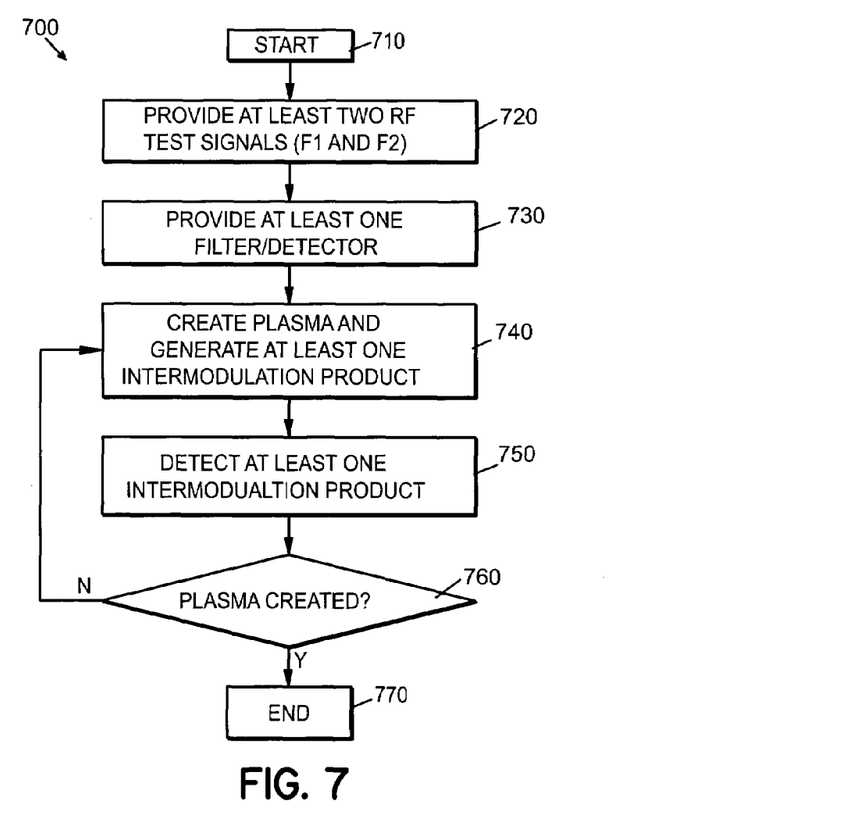
FIG. 7 illustrates a method for monitoring a material processing system according to an embodiment of the present invention.

FIG. 7 illustrates a method for monitoring a material processing system according to an embodiment of the present invention. Procedure 700 begins in 710.

In 720, at least two RF test signals (F1 and F2) can be provided. RF test signals can be provided using a number of different techniques to insert the test signals into a process chamber. For example, RF test signals can be inserted using one or more antennas coupled to the process chamber, or RF test signals can be inserted along with the RF bias signal using at least one of an upper assembly component, and a substrate holder component.

In 730, a filter/detector can be provided. A filter/detector can be provided in a number of different locations in a processing system. For example, a filter/detector can be coupled to at least one of a process chamber component, an upper assembly component, and substrate holder component. Alternately, a filter/detector can be coupled to a monitoring port or another input port.

In 740, plasma can be created and intermodulation products are generated that are related to the two RF test signals. For example, intermodulation products can be generated according to the following (n*F1+/−m*F2).

In 750, at least one intermodulation product can be detected to determine when plasma has been generated. For example, a $5^{th}$ order or a $7^{th}$ order intermodulation product can be detected.

In 760, a query can be performed to determine if a plasma has been created and the process can continue. Procedure 700 ends in 770.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A plasma processing system comprising:
a processing tool having a process chamber;
means coupled to the process chamber for providing in the process chamber at least two signals in a frequency range effective to couple energy to and from a plasma in the process chamber, depending on the parameters of the system, the signals including a first signal at a first frequency and a second signal at a second frequency selected to produce an inter-modulation product at a third frequency in said frequency range that is neither equal to nor a multiple of the first frequency or the second frequency;
means for detecting the inter-modulation product from energy coupled from a plasma in the chamber; and
means coupled to the means for detecting the inter-modulation product, said coupled means programmed for producing an output signal indicating the presence of a plasma in the chamber in response to the detection of the inter-modulation product and indicating the absence of a plasma from the chamber in response to an absence of the detection of the inter-modulation product.

2. The plasma processing system of claim 1 further comprising:
means for controlling the operation of the processing tool in response to the output signal.

3. The plasma processing system of claim 1 further comprising:
means for controlling the operation of the processing tool in response to the output signal to perform a plasma process in the chamber when indicating the presence of the plasma and to suspend processing when indicating the absence of a plasma.

4. The plasma processing system of claim 1 wherein the inter-modulation product includes an odd-order product of the first RF signal and the second RF signal.

5. The plasma processing system of claim 1 wherein the inter-modulation product includes a fifth-order product of the first RF signal and the second RF signal.

6. The plasma processing system of claim 1 wherein the inter-modulation product includes a seventh-order product of the first RF signal and the second RF signal.

7. A plasma processing system comprising:
a processing tool having a vacuum process chamber;
at least one RF energy source coupled to the process chamber and operable to provide in the process chamber a first RF signal at a first frequency and a second RF signal at a second frequency, both signals being in a frequency range effective to couple energy to and from a plasma in the process chamber, depending on the parameters of the system, the first and second frequencies being selected to produce, if multiplied together, an inter-modulation product at a frequency in said frequency range that is neither equal to nor a multiple of the first frequency or the second frequency;
a band-pass filter/detector operable to detect the inter-modulation product from energy coupled from a plasma in the chamber; and
a controller coupled to the filter/detector and programmed to produce an output indicating the presence of a plasma in the chamber in response to the detection of the inter-modulation product and indicating the absence of a plasma from the chamber in response to an absence of the detection of the inter-modulation product.

8. The plasma processing system of claim 7 wherein:
the at least one RF energy source includes a plasma-sustaining source of RF energy coupled to the chamber to sustain a plasma in the chamber; and
the RF energy includes one of the first and second signals.

9. The plasma processing system of claim 7 further comprising:
a substrate support in the chamber;
the at least one RF energy source including a bias potential source of RF energy coupled to the substrate support to bias a substrate on the support; and
the RF energy includes one of the first and second signals.

10. The plasma processing system of claim 7 further comprising:
a target in the chamber;
the at least one RF energy source including a source of RF energy coupled to the target to sputter the target; and
the RF energy includes one of the first and second signals.

11. The plasma processing system of claim 7 wherein:
one or both of the first and second signals includes RF energy coupled to the chamber for purposes other than energizing a plasma, biasing a substrate or sputtering a target and for serving as a test signal.

12. The plasma processing system of claim 7 further comprising:
a substrate support in the chamber;
a target in the chamber;
one of the first and second signals including RF energy from the at least one RF energy source that includes either:
a plasma-sustaining source of RF energy coupled to the chamber to sustain a plasma in the chamber;
a bias potential source of RF energy coupled to the substrate support to bias a substrate on the support; or
a sputtering energy source of RF energy coupled to the target to sputter the target; and
the other one of the first and second signals including RF energy from a different one of the at least one RF energy source that includes either:
a plasma-sustaining source of RF energy coupled to the chamber to sustain a plasma in the chamber;
a bias potential source of RF energy coupled to the substrate support to bias a substrate on the support;
a sputtering energy source of RF energy coupled to the target to sputter the target; or
a test source of RF energy coupled to the chamber for purposes other than energizing a plasma, biasing a substrate or sputtering a target and for serving as a test signal.

13. The plasma processing system of claim 7 further comprising:
an antenna coupled to the detector that relies on a substrate support, a plasma electrode or an RF coupling component in the process chamber.

14. The plasma processing system of claim 7 further comprising:
an antenna coupled to the detector that is distinct from a substrate support, a plasma electrode or other RF coupling component in the process chamber.

15. The plasma processing system of claim 7 further comprising:
control logic in the controller responsive to the filter/detector; and
one or more monitoring devices controlled by the control logic so that performance of a process in the chamber can be conditioned on the presence of a plasma in the chamber.

16. The plasma processing system of claim 7 further comprising:
process control logic in the controller responsive to the filter/detector and operable to condition performance of a process in the chamber on the presence of a plasma in the chamber.

17. The plasma processing system of claim 7 wherein:
the power source comprises at least one of an RF-to-DC converter configured to convert energy emitted from a process related signal into a DC signal, an RF-to-DC converter configured to convert a non-process related signal into a DC signal, a DC-to-DC converter, and a battery.

18. The plasma processing system of claim 7 wherein:
the controller comprises at least one of a microprocessor, a microcontroller, a timer, digital signal processor (DSP), memory, receiver, A/D converter, and D/A converter.

19. The plasma processing system of claim 7 wherein:
the at least one RF source includes a sine wave oscillator.

* * * * *

UNITED STATES PATENT AND TRADEMARK OFFICE
CERTIFICATE OF CORRECTION

| | | |
|---|---|---|
| PATENT NO. | : 7,314,537 B2 | Page 1 of 1 |
| APPLICATION NO. | : 10/674920 | |
| DATED | : January 1, 2008 | |
| INVENTOR(S) | : Craig T. Baldwin et al. | |

It is certified that error appears in the above-identified patent and that said Letters Patent is hereby corrected as shown below:

In the Drawings, Fig. 7, at box 750, "INTERMODLATION" should read --INTERMODULATION--.

In column 1, line 54, "particularly, to an apparatus" should read --particularly, an apparatus--.

In column 3, line 14, "of the two signals are" should read --of the two signals is--.
In column 3, line 45, "system 100 can comprises a batch" should read --system 100 can comprise a batch--.

In column 5, line 64, "system 200 can comprises a batch" should read --system 200 can comprise a batch--.

In column 13, line 38, "106.25-826.3" should read --106.25=826.3--.
In column 13, line 43, "Toko Electronics" should read --Tokyo Electronics--.

Signed and Sealed this

Fourteenth Day of April, 2009

JOHN DOLL
*Acting Director of the United States Patent and Trademark Office*